United States Patent [19]

Yamaki et al.

[11] Patent Number: 4,680,569
[45] Date of Patent: Jul. 14, 1987

[54] SEMICONDUCTOR PRESSURE SENSOR

[75] Inventors: Bunshiro Yamaki, Fujisawa; Sadatake Kikuchi, Hyogo; Yutaka Tomisawa, Yokohama, all of Japan

[73] Assignee: Kabushiki Kaisha Toshiba, Kanagawa, Japan

[21] Appl. No.: 654,940

[22] Filed: Sep. 27, 1984

[30] Foreign Application Priority Data

Sep. 30, 1983 [JP] Japan .................. 58-180440

[51] Int. Cl.⁴ .............................. G01L 1/22
[52] U.S. Cl. ......................... 338/42; 338/5; 338/4; 338/36
[58] Field of Search ............... 338/4, 42, 2, 36, 34, 338/5; 73/23, 27 R, 727, 721; 228/229, 123

[56] References Cited

U.S. PATENT DOCUMENTS

| | | | |
|---|---|---|---|
| 4,127,840 | 11/1978 | House | 338/4 |
| 4,412,203 | 10/1983 | Kurtz et al. | 338/4 |
| 4,499,774 | 2/1985 | Tsuchiya et al. | 73/727 |
| 4,502,335 | 3/1985 | Wamstad et al. | 73/721 |
| 4,540,115 | 9/1985 | Hawrylo | 228/229 X |

FOREIGN PATENT DOCUMENTS 57-23849  2/1982  Japan ........................... 73/13

OTHER PUBLICATIONS

Yamada et al, "A Piezoresistive Integrated Pressure Sensor", Sensors and Actuators, 4 (1983), pp. 63–69.
Takahama et al, "Diffused Silicon Pressure Sensor", UDC, 531.787.91.084, Aug., 1981, pp. 518–522.

Primary Examiner—E. A. Goldberg
Assistant Examiner—M. M. Lateef
Attorney, Agent, or Firm—Schwartz, Jeffery, Schwaab, Mack, Blumenthal & Evans

[57] ABSTRACT

A semiconductor pressure sensor wherein a semiconductor chip of diaphragm type is supported by a mount plate through a thin tubular supporting member or a pressure inlet tube having a coefficient of thermal expansion similar to that of a substrate constituting the semiconductor chip. The semiconductor chip is fixed to the thin tubular supporting member or the pressure inlet tube by means of a bonding material, and the thin tubular supporting member or the pressure inlet tube is fixed by means of a bonding material having a high bonding strength with respect thereto, thus absorbing thermal stress produced due to the difference in coefficient of thermal expansion.

10 Claims, 9 Drawing Figures

SEMICONDUCTOR PRESSURE SENSOR

BACKGROUND OF THE INVENTION

The present invention relates to a semiconductor pressure sensor, and more particularly to an improved semiconductor pressure sensor having higher sensitivity and good temperature characteristics as compared to conventional sensors and capable of being fabricated at a low cost.

Referring to FIG. 1, there is shown a typical arrangement of a known semiconductor pressure sensor of absolute pressure type. The pressure sensor is provided with a hollow shell member 1 comprising a rigid mount plate 1A and a cap 1B fixed to the mount plate 1A, wherein a semiconductor chip 2 of diaphragm type which forms the body portion of the sensor and a semiconductor (e.g. silicon) base member 3 for supporting the chip 2 are accommodated within the shell 1. As well known, the chip 2 is configured by scooping the central portion of a semiconductor thin plate to form a diaphragm portion having a thin thickness, thereafter selectively doping impurities into the diaphragm portion to form a resistor constituting a strain gauge. A lead wire 4 connected to the resistor within the chip 2 is connected to external leads 5 inserted into the shell 1.

In order to apply mechanical displacement to the diaphragm portion of the chip 2 the base member 3 is provided with a pressure inlet bore 3a opening toward the diaphragm portion through the base member 3 supporting the chip 2 and the pressure inlet bore 3a communicates with a bore 1a provided through the mount plate 1A of the shell 1.

The base member 3 serves as not only a supporting member for supporting the chip 2, but also a thermal buffering member for shielding undesired thermal influence externally applied at a time of production of the sensor and/or using thereof. Accordingly, the base member 3 is formed of silicon having the same coefficient of thermal expansion as that of constituent material of the chip 2.

Outside the mount plate 1A of the shell 1, a pressure inlet tube 6 communicating with the bore 1a is fixedly attached. Thus, gas (air) passing through the pressure inlet tube 6 causes mechanical displacement in the diaphragm portion of the chip 2.

The mount plate 1A is further provided with lead leading-out holes for inserting the external lead 5. The mount plate 1A is configured so that a seal ring 7 fitted into each of the lead leading-out holes does not allow air outside the shell 1 to enter thereinto.

The connections between the chip 2 and the base member 3 and between the base member 3 and the mount plate 1A are carried out by means of a solder of Pb-Sn family, respectively. The chip 2 is securely mounted on the mount plate 1A through the base member 3. The mount plate 1A is made of 42% Ni-Fe alloy which will be called "NSD" hereinafter.

When designing such known semiconductor pressure sensors, it is preferable that the height of the base member 3 is as large as possible, while the lateral cross section thereof is as small as possible, in order to minimize thermal variations of characteristics and mechanical distortion applied to the chip. However, if the lateral cross section is small, the diameter of the chip 2 (i.e. the diameter of the diaphragm portion of the chip 2) becomes small. This makes it impossible to sense the pressure with high sensitivity, leading to inconsistent result that high performance in regard to the sensitivity of the sensor cannot be expected.

For this reason, in conventional semiconductor pressure sensors, the base member 3 has been designed so that the cross section of the base member 3 is small and the height of the base member 3 is large in order to meet the requirement of minimization in the above-mentioned undesired thermal influence and mechanical distortion, in addition to this, the chip has been formed so that the diaphragm portion is as thin as possible in order to improve the sensitivity of the sensor. Further, in order that large residual stress and thermal distortion are not produced between the base member 3 having small coefficient of thermal expansion and the mount plate 1A having large coefficient thereof at producing step of the sensor, and that the heat applied to the chip 2 is as small as possible, a soft solder of Pb-Sn family having a low melting point has been used as a bonding material.

The drawbacks with the above-mentioned semiconductor pressure sensors are as follows.

First, the fraction defective is large because it is necessary to make the diaphragm portion of the chip 2 extremely thin, resulting in low yield in the step for production of the chip and high cost in the production thereof.

Second, since the diaphragm of the chip 2 cannot have large diameter, it is impossible to fabricate a high sensitive sensor.

Third, since the pressure inlet bore 3a provided through the base member 3 is formed by an ultrasonic machining which generally takes long time, the larger the height of the base member 3 is, the longer the time required for machining is, resulting in high production cost of the base member 3.

Fourth, since the adhesion area of the base member 3 with respect to the mount plate 1A is still relatively large, thermal distortion produced between the base member 3 and the mount plate 1A due to the heat externally conducting into the shell 1 is considerably large, which is not negligible.

Fifth, since the base member 3 and the mount plate 1A are joined using a solder having a low melting point so that thermal distortion produced therebetween becomes small, the sensor cannot be used under environment of relatively high temperature or under environment where temperature greately changes. Further, as stated above, since the adhesion area of the base member 3 with respect to the mount plate 1A is still large, temperature changes outside the shell have large influence on the chip 2 through the base member 3, resulting in a sensor having bad temperature characteristics.

Sixth, since the height of the base member 3 is large, the height of the inner lead is also large. As a result, there occurs vibration of the lead at a time of bonding, thereby to narrow a range of conditions for optimum wire bonding, thus making it difficult to maintain quality of the bonding.

Seventh, when the base member 3 is joined to the mount plate 1A and then lead wire connection is implemented, thereafter the cap 1B is fixed to the mount plate 1A, if the adhesion area of the base member 3 with respect to the mount plate 1A is large, there occurs large distortion in the base member 3 after the cap 1B has been mounted, resulting in undesired effect on the sensitivity of the sensor, etc. It is to be noted that in the conventional sensors of this kind, the sensitivity of the sensor after the cap is mounted generally lowers as compared to that before the cap is mounted.

In the prior art, in order to lessen inconveniences caused by drawbacks as stated in the above-mentioned fourth and fifth items, as shown in FIGS. 2(a) and 2(b), there have been used improved base members 3A and 3B in which recesses are provided in the radial direction. However, since the adhesion area between these base members 3A and 3B and the mount plate 1A is still large, it is difficult to sufficiently solve fourth and fifth drawbacks and other drawbacks remain as they are.

Further, another attempt has been made to mount the base member on the mount plate through a pipe member. Although inconvenience caused by the fourth and fifth drawbacks can be lessened, no particular consideration is given to the mounting between the pipe member and the base member or the mount plate, resulting in difficulty in sufficiently eliminating thermal distortion, etc.

SUMMARY OF THE INVENTION

With the above in view, an object of the present invention is to provide an improved semiconductor pressure sensor which is not influenced to much extent by the above-mentioned drawbacks, and more specifically to provide an improved semiconductor pressure sensor which has higher sensitivity and good temperature characteristics as compared to the prior art sensors, facilitates wire bonding process, and is able to fabricate at a low cost.

The improved semiconductor pressure sensor according to the present invention allows mounting of a chip including a diaphragm portion having a diameter and a thickness which are both larger than those of prior art sensors, and therefore presents a higher sensitivity than that of prior art sensors. Further, the improved semiconductor pressure sensor according to the present invention is characterized by the provision of structure to produce little possibility that undesired deformation occurs in the mounting portion of the chip during production and use of the sensor.

More particularly, the semiconductor pressure sensor according to the present invention is characterized in that a chip or a base member for mounting the chip is joined to a thin tubular supporting member having a coefficient of thermal expansion similar to that of the material constituting the chip or the base member, and the thin tubular supporting member is fixed to the mount plate by means of a bond having large bonding strength with respect to the thin tubular supporting member. Namely, the chip is directly joined to the extreme end of the thin tubular supporting member having a coefficient of thermal expansion similar to that of the substrate of the chip, or is joined thereto through a base member having a coefficient of thermal expansion similar to that of the substrate of the chip by means of a bond. The thin tubular supporting member is fixedly joined to the mount plate by means of a bond having large bonding strength with respect to the thin tubular supporting member. Namely, the joining to each other among the chip, the base member and the thin tubular supporting member can be sufficiently implemented by means of a soft bond having a small bonding strength because of small thermal stress produced. On the other hand, since there occurs large thermal stress between the thin tubular supporting member and the mount plate, the joining therebetween is implemented using a hard bond having a large mechanical bonding strength.

DETAILED DESCRIPTION OF THE PREFERRED EMBODIMENTS

Figure 3:
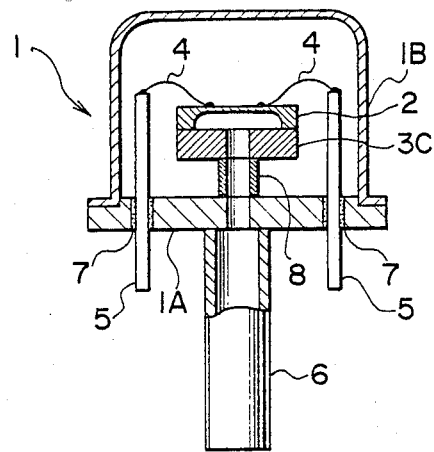
FIG. 3 is a longitudinal cross sectional view illustrating an embodiment of a semiconductor pressure sensor according to the present invention.

Referring to FIG. 3, there is shown an embodiment of a semiconductor pressure sensor according to the present invention. In this figure, the components identical to those in FIG. 1 are designated by the same reference numerals, respectively, the explanation in regard to the same portions will be omitted.

Figure 1:
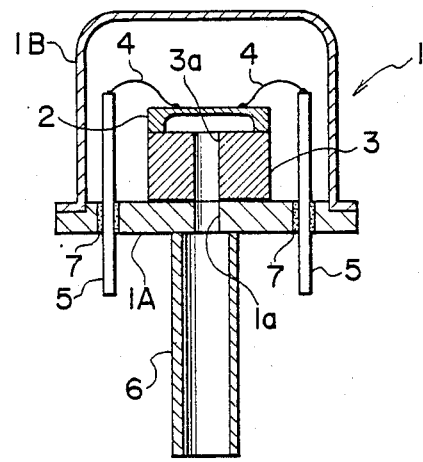
FIG. 1 is a longitudinal cross sectional view illustrating a conventional semiconductor pressure sensor.
Figure 2A:
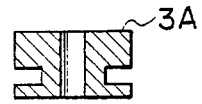
FIGS. 2(a) and 2(b) are cross sectional views illustrating conventional proposed improved base members, respectively.
Figure 2B:
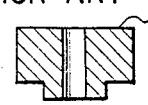

As compared to the conventional sensor shown in FIG. 1, the sensor shown in FIG. 3 has following features: First is to use chip 2 having a large diameter. Second is to provide base member 3C having a low height. Third is to support the base member 3C on mount plate 1A through a thin tubular supporting member 8 so that the base member 3C is not directly in contact with the mount plate 1A. The tubular supporting member 8 is made of material having a coefficient of thermal expansion similar to that of the material of the chip, e.g. silicon, or material having a coefficient of thermal expansion smaller than that of silicon. Namely, the constituent material of the tubular supporting member 8 may be a conductive material, e.g. 39% Ni-Fe alloy (which will be referred to INL hereinafter) or 36% Ni-Fe alloy (which will be referred to ING hereinafter), etc., or an insulating material, e.g. zirconia, etc. When an insulating material is used, metallization is made at least at the bonding portion.

The INL has a coefficient of thermal expansion up to about 100° C. which is the same as that of silicon, i.e. $30 \times 10^{-7}/°$ C., and has a yielding temperature of 250° to 260° C. The ING has a coefficient of thermal expansion from a room temperature up to about 100° C. of $(8-15) \times 10^{-7}/°$ C., which is smaller than that of silicon, and has a yielding temperature of about 150° C. The zirconia has a coefficient of thermal expansion from 40° C. to 400° C. of $37 \times 10^{-7}/°$ which is similar to that of silicon.

The contact surface of the chip 2 and the base member 3C and the contact surface of the base member 3C and the tubular supporting member 8 are both joined by means of a conventional solder of Pb-Sn family, and the contact surface of the tubular supporting member 8 and the mount plate 1A is joined using a solder of Au-20% Sn having a high melting point (e.g., 280° C.). Since the melting point of this solder is extremely close to the yielding temperature of 250° to 260° C. of the INL as constituent material of the tubular supporting member 8, there is little possibility that residual stress or thermal distortion occurs between the tubular supporting member 8 and the mount plate 1A even if the former is joined to the latter having a coefficient of thermal expansion greately different from that of the former. It is to be noted that both the contact surface of the chip 2 and the base member 3C and the contact surface of the base member 3C and the tubular supporting member 8 may be joined using a solder of Au-20% Sn having a high melting point.

In this embodiment, the base member 3C is square having 4 mm in each side and has the thickness of 2 mm, the thickness (height) being one half of the base member of the conventional sensor. The tubular supporting member 8 has thickness of about 0.5 mm, outer diameter of 1.5 to 2.5 mm, inner diameter of 0.5 to 1.5 mm, and height (length) of more than 0.5 mm, e.g , 1.0 mm. The tubular supporting member 8 is shaped so that outer diameter thereof is slightly larger than the bore provided through the mount plate 1A. Accordingly, contact surface with respect to the mount plate 1A is extremely smaller than that of the prior art base member.

Since the base member 3C is not in contact with the mount plate 1A in the embodiment shown in FIG. 3, the base member 3C has small thermal influence from the mount plate 1A. Further, since the base member 3C is supported on the tubular supporting member 8 having a coefficient of thermal expansion similar to that of silicon in a manner that the contact area therebetween is extremely small, effect due to thermal distortion in the joint portion between the base member 3C and the mount plate 1A is small. Further, the stress produced between the mount plate 1A and the tubular supporting member 8 whose coefficients of thermal expansion are different from each other is absorbed by high temperature solder having a large bonding strength, thus giving no undesired influence to the base member 3A and the chip 2.

For this reason, the semiconductor pressure sensor shown in FIG. 3 has a small thermal influence with respect to the base member. Accordingly, this makes it possible to decrease the thickness of the base member and enlarge its diameter as compared to that of the conventional sensor. Therefore, it is possible to enlarge the diameter of the chip 2 and increase the thickness of the diaphragm portion in comparison to conventional ones. Thus, with the semiconductor pressure sensor shown in FIG. 3, high sensitivity and good temperature characteristic can be obtained.

Because of reduced height of the base member, the length of the pressure inlet bore of the base member is lessened, thereby to reduce the machining cost and the machining time required for boring. Further, the thickness of the film of the chip is enlarged, thereby improving the production yield of the chip. As a result, the production cost for the sensor is reduced. Further, the production cost for the metallic tubular supporting member is extremely low.

Figure 4:
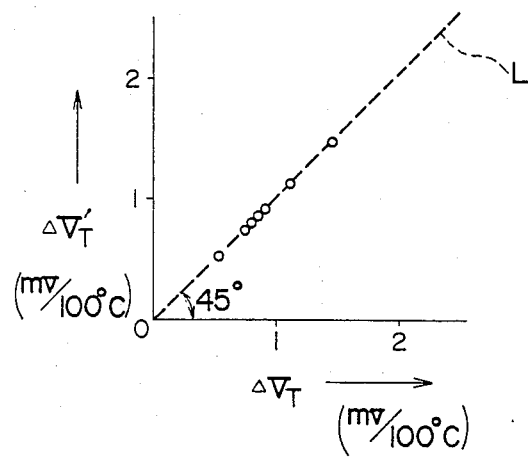
FIG. 4 is a graph showing an example of the characteristic of the sensor shown in FIG. 3.

FIG. 4 is a graph showing an experimental result obtained with the semiconductor pressure sensor shown in FIG. 3, wherein there is plotted the relationship between the measured output error voltage $\Delta V_T$ (mV/100° C.) before the cap 1B is mounted and the measured output error voltage $\Delta V'_T$ (mV/100° C.) after the cap 1B is mounted. In this graph, small circles denote measured values, and it is seen from this figure that measured values are aligned on a rectilinear line L inclined at an angle of 45°. Accordingly, it is appreciated that the output errors do not occur between before the cap 1B is mounted and thereafter. Namely, this means that when the semiconductor pressure sensor shown in FIG. 3 is used, the distortion produced by mounting the cap 1B has not any influence on the base member 3C.

Figure 5:
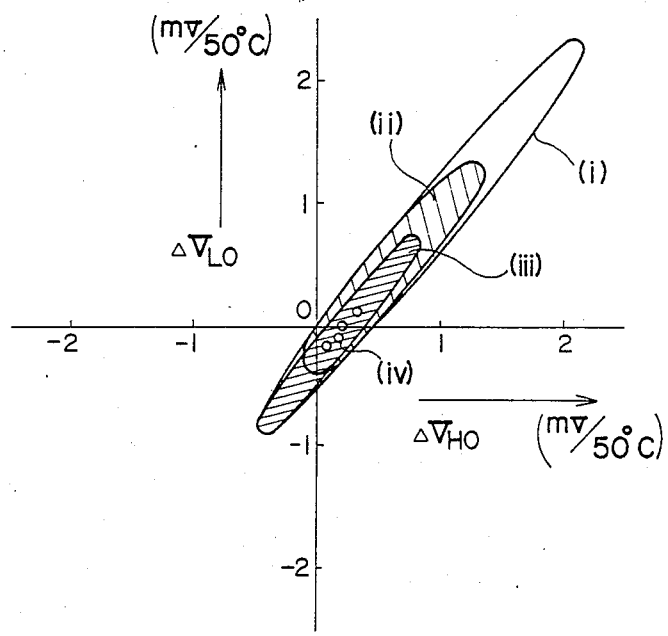
FIG. 5 is a graph showing zero point temperature error characteristics of the sensors shown in FIGS. 1 and 3, respectively, and zero point temperature error characteristics of the strain gauges formed in the chips.

FIG. 5 is a graph plotting observed temperature error characteristics at the pressure of zero (which will be called "zero point temperature characteristics") in connection with some samples of semiconductor pressure sensors and the chip without cap, wherein (i) denotes the zero point temperature error region of the prior art semiconductor pressure sensor, (ii) that of the pressure sensor according to the present invention provided with the tubular supporting member 8 of INL, (iii) that of the pressure sensor according to the present invention provided with the tubular supporting member 8 of ING and (iv) which is indicated by dots denotes that of the chip without cap, etc. In this figure, the abscissa designates a zero point temperature error $\Delta V_{HO}$ (mV/50° C.) which is the difference of the output at room temperature (hereinafter R.T.) from the output at (RT+50)° C. and the coordinate designates a zero point temperature error $\Delta V_{LO}$ (mV/50° C.) which is the difference of the output at (RT−50)° C. from the output at R.T.

As seen from FIG. 5, the zero point temperature error characteristic of the sensor according to the present invention is extremely improved as compared to that of the prior art sensor. Particularly, it is appreciated that the zero point temperature error characteristic of the sensor according to the present invention as indicated by (iii) is close to that of the chip without cap, According to the semiconductor pressure sensor of the present invention, the provision of the tubular supporting member 8 implemented as stated above results in thinning of the base member. Accordingly, the development of this concept will result in a structure which has no base member, thus enabling to directly mount the chip 2 on the tubular supporting member 8. In this instance, it is preferable that the outer diameter of the tubular supporting member 8 is equal to or smaller than that of the pressure inlet tube 6 projected outwardly from the mount plate 1A, in order to provide stress reduction effect. If such structure is further developed, the tubular supporting member 8 and the pressure inlet tube 6 can be integrated with each other.

Figure 6:
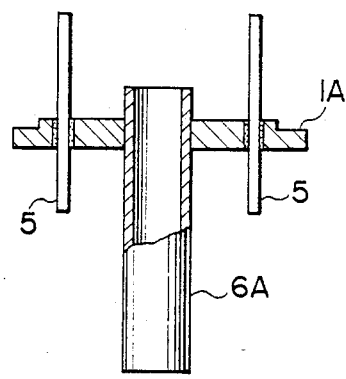
FIGS. 6 to 8 are longitudinal cross sectional views illustrating only primary parts of other embodiments of semiconductor pressure sensers according to the present invention, respectively.
Figure 7:
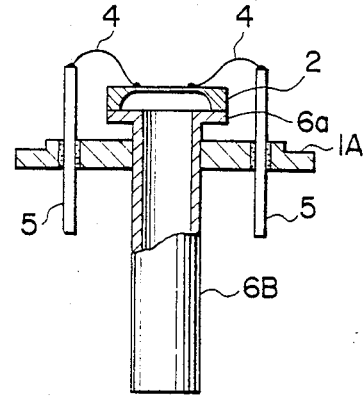
Figure 8:
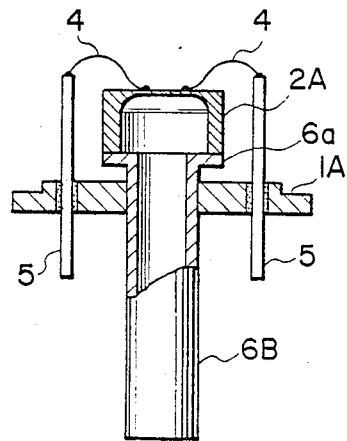

Referring to FIGS. 6 to 8, there are shown some examples of sensors configured by implementing the above-mentioned idea.

FIG. 6 shows a modification of the sensor shown in FIG. 3 wherein the tubular supporting member 8 and the pressure inlet tube 6 are incorporated to form a pressure inlet tube 6A inserted into the inside of the shell 1.

In this embodiment, the base member 3C is joined to the inner end of the pressure inlet tube 6A inserted into the shell by means of a usual solder of Pb-Sn, and the pressure inlet tube 6A is joined to the mount plate 1A by means of a high temperature solder, thus requiring no separate tubular supporting member 8. In this instance, the whole pressure inlet tube 6A may be formed by INL, ING or zirconia. However, instead of this, solely the portion which is outside of the pressure inlet tube 6A which is bonded to the mount plate 1A may be formed by material other than INL, ING or zirconia, and the contact portion and the portion inside thereof may be formed by INL, ING or zirconia.

FIG. 7 shows another modification wherein instead of the pressure inlet tube 6A of FIG. 6 embodiment, there is used a pressure inlet tube 6B provided at the top thereof with a flat shaped base portion 6A for joining a chip. In this example, the base member 3C of silicon is not required, so that the chip is directly joined on the base portion 6a.

FIG. 8 shows a further modification wherein the pressure inlet tube 6B identical to that of FIG. 7 embodiment is provided, but in this embodiment a chip 2A having a thickness considerably larger than that of conventional chip is mounted on the pressure inlet tube 6B.

Thus, the using of the chip 2A having large thickness can lessen changes in the temperature characteristic, thereby providing advantages of improved temperature characteristic and uniformity of the sensor.

It is here noted that, in the embodiments shown in FIGS. 7 and 8, it is impossible to enlarge to much extent the thickness of the base portion 6a for joining a chip because it is limited by the size of the chip, etc. Namely, this is because, if the thickness of the base portion 6a is larger than a predetermined one, stress produced due to the difference between the coefficient of thermal expansion of silicon which is constituent material of the chip and that of INL, etc. which is constituent material of the base portion 6a cannot be absorbed by a joining solder layer interposed therebetween.

The sensor as shown in FIGS. 7 and 8 requires no base member of silicon, thereby reducing the number of parts and machining cost. Further, since the contact area for solder in these embodiments is reduced as compared to that of FIG. 3 embodiment, thereby further lessening mechanical distortion or undesired thermal influence at the chip mounting portion due to the contact surface of the solder, etc.

As stated above, the present invention provides an improved semiconductor pressure sensor which can eliminate previously mentioned drawbacks encountered with conventional semiconductor pressure sensors, and is provided with following advantages.

(A) Since it is possible to use a chip provided with a diaphragm portion having a diameter and a thickness which are both larger than those of conventional ones, production yield of the chip is improved, thereby enabling to reduce the production cost thereof and fabricate a sensor having high sensitivity.

(B) It is possible to lessen undesired effect on the chip mount portion, which is caused by mechanical distortion or thermal distortion due to the contact portion of solder, etc. Accordingly, this makes it possible to fabricate a sensor having good temperature characteristic and high precision.

(C) Since the thickness of the base member can be thinned using a metallic thin tubular member or a pressure inlet tube, or the base member is not required, it is possible to reduce the cost, particularly machining cost, thus allowing the production cost of the sensor to be reduced.

(D) Since a high temperature solder is used as a bond having large mechanical strength in the contact portion in which the difference of coefficient of thermal expansion is large, the sensor having good temperature characteristic and good temperature stability over a wide temperature range can be obtained.

(E) An increase in the height of the upper surface of the semiconductor chip can be suitably limited to an allowable height, thus enabling to implement stable bonding to make it possible to improve the stability of quality.

In the above-mentioned embodiments, sensors of absolute pressure type have been described, but it is obvious that the present invention is applicable to other types of sensors, e.g. subatmospheric pressure type, supraatmospheric pressure type, or differential pressure type, etc.

What is claimed is:

1. A semiconductor pressure sensor comprising:
   a hollow shell comprising a mount plate having a bore provided therethrough and a cap fixed on the mount plate;
   a pressure inlet tube fixed to the mount plate and projecting toward the outside of the shell;
   the pressure inlet tube communicating with the bore;
   a semiconductor chip received within said shell, said semiconductor chip being provided with a thin diaphragm portion in which a strain gauge is formed;
   a base member on which said semiconductor chip is mounted, said base member having a coefficient of thermal expansion similar to that of said semiconductor chip; and
   a thin tubular supporting member to which said base member is fixed, said thin tubular supporting member communicating with said bore and having a coefficient of thermal expansion similar to that of said semiconductor chip;
   said base member being bonded to said thin tubular supporting member by a soft solder material, and said thin tubular supporting member being bonded to said mount plate by a hard solder material.

2. A pressure sensor according to claim 1, wherein said soft solder material is a solder of the Pb-Sn family, and said hard solder material is a solder of the Au-20% Sn family.

3. A pressure sensor according to claim 1, wherein said thin tubular supporting member is made of cobalt free 39% Ni-Fe alloy.

4. A pressure sensor according to claim 1, wherein said thin tubular supporting member is made of cobalt free 36% Ni-Fe alloy.

5. A pressure sensor according to claim 1, wherein said thin tubular supporting member is made of ceramic containing zirconium as a major component thereof and is metallized at least at the bonding part.

6. A semiconductor pressure sensor comprising:
   a hollow shell comprising a mount plate having a bore provided therethrough and a cap fixed on the mount plate;
   a pressure inlet tube fixed to the mount plate and projecting toward the outside of the shell;
   a semiconductor chip received in said shell, said semiconductor chip being provided with a thin diaphragm portion in which a strain gauge is formed;
   the pressure inlet tube communicating with the bore;
   the pressure inlet tube being made of material having a coefficient of thermal expansion similar to that of said semiconductor chip and being made to penetrate through the mount plate within said shell; and
   the chip being directly fixed to the inner end of said pressure inlet tube within said shell by a soft solder material, and said pressure inlet tube being bonded to said mount plate by a hard solder material.

7. A pressure sensor according to claim 6, wherein said soft solder material is a solder of the Pb-Sn family, and said hard solder material is a solder of the Au-20% Sn family.

8. A pressure sensor according to claim 6, wherein said thin tubular supporting member is made of cobalt free 39% Ni-Fe alloy.

9. A pressure sensor according to claim 6, wherein said thin tubular supporting member is made of cobalt free 36% Ni-Fe alloy.

10. A pressure sensor according to claim 6, wherein said thin tubular supporting member is made of ceramic containing zirconium as a major component thereof and is metallized at least at the bonding part.

* * * * *